US009563029B2

United States Patent
Saeki (10) Patent No.: US 9,563,029 B2
(45) Date of Patent: Feb. 7, 2017

(54) OPTICAL MODULE WITH ENHANCED HEAT DISSIPATING FUNCTION

(71) Applicant: Sumitomo Electric Device Innovations, Inc., Yokohama-shi (JP)

(72) Inventor: Tomoya Saeki, Yokohama (JP)

(73) Assignee: Sumitomo Electric Device Innovations, Inc., Yokohama-shi (JP)

( * ) Notice: Subject to any disclaimer, the term of this patent is extended or adjusted under 35 U.S.C. 154(b) by 178 days.

(21) Appl. No.: 14/366,918

(22) PCT Filed: Feb. 27, 2013

(86) PCT No.: PCT/JP2013/056052
§ 371 (c)(1),
(2) Date: Jun. 19, 2014

(87) PCT Pub. No.: WO2013/129689
PCT Pub. Date: Sep. 6, 2013

(65) Prior Publication Data
US 2014/0345297 A1    Nov. 27, 2014

(30) Foreign Application Priority Data
Feb. 28, 2012   (JP) ................... 2012-042259

(51) Int. Cl.
*G02B 6/42* (2006.01)
*H01S 5/022* (2006.01)
(Continued)

(52) U.S. Cl.
CPC ............. *G02B 6/4271* (2013.01); *F25B 21/02* (2013.01); *H01S 5/02208* (2013.01);
(Continued)

(58) Field of Classification Search
CPC .............. G02B 6/4271; H01S 5/02284; H01S 5/02208; H01S 5/02469; H01S 5/02415
See application file for complete search history.

(56) References Cited

U.S. PATENT DOCUMENTS

| 5,729,375 A | 3/1998 | Klein et al. |
| 2002/0018500 A1 | 2/2002 | Aikiyo et al. |

(Continued)

FOREIGN PATENT DOCUMENTS

| JP | 2004-170809 A | 6/2004 |
| JP | 2007-155863 A | 6/2007 |

(Continued)

OTHER PUBLICATIONS

Notice of Reasons for Rejection in Japanese Patent Application No. 2012-042259, dated Jan. 5, 2016.
(Continued)

*Primary Examiner* — Dung Nguyen
(74) *Attorney, Agent, or Firm* — Venable LLP; Michael A. Sartori; F. Brock Riggs (57) ABSTRACT

An optical module to enhance the heat dissipating function is disclosed. The optical module includes an optical assembly, a heat spreader, and a holder. The optical assembly emits light and dissipates heat in directions opposite to each other. The heat spreader is attached to the bottom of the optical assembly to conduct heat from the optical assembly effective to the outside. The holder securely holds the intermediate assembly of the optical assembly and the heat spreader.

10 Claims, 9 Drawing Sheets

(51) Int. Cl.
*F25B 21/02* (2006.01)
*H01S 5/024* (2006.01)
*H05K 1/02* (2006.01)

(52) U.S. Cl.
CPC ...... *H01S 5/02284* (2013.01); *F25B 2321/02* (2013.01); *H01S 5/02292* (2013.01); *H01S 5/02415* (2013.01); *H01S 5/02469* (2013.01); *H05K 1/028* (2013.01)

(56) References Cited

U.S. PATENT DOCUMENTS

| | | |
|---|---|---|
| 2005/0207458 A1 | 9/2005 | Zheng |
| 2009/0016391 A1 | 1/2009 | Kalberer |
| 2012/0045182 A1 | 2/2012 | Ishii et al. |
| 2012/0045183 A1 | 2/2012 | Fujimura et al. |

FOREIGN PATENT DOCUMENTS

| | | |
|---|---|---|
| JP | 2010-129667 A | 6/2010 |
| JP | 2012-015488 A | 1/2012 |
| JP | 2012-023325 A | 2/2012 |
| WO | WO-2010/131767 A2 | 11/2010 |
| WO | WO2011/152555 * | 12/2011 |
| WO | WO-2011/152555 A1 | 12/2011 |

OTHER PUBLICATIONS

International Search Report and Written Opinion in PCT International Application No. PCT/JP2013/056052, dated Sep. 30, 2013.
Notification of the First Office Action in Chinese Patent Application No. 2013800115526, issued Feb. 2, 2016.

* cited by examiner

OPTICAL MODULE WITH ENHANCED HEAT DISSIPATING FUNCTION

TECHNICAL FIELD

The present invention relates to an optical module that provides an enhanced heat dissipating function.

BACKGROUND ART

Optical modules with a box shaped package and lead terminals laterally extending from the sides of the box shaped package have been well known as, what is called, the butterfly module. Such butterfly modules emit light in a direction substantially in parallel to the bottom thereof. Even when the butterfly module implements a thermo-electric cooler (hereafter denoted as TEC) to control a temperature of a light-emitting device, typically a semiconductor laser diode (hereafter denoted as LD), the TEC may be mounted on the bottom of the module, because the light is extracted from a side of the module.

The butterfly module, in particular, the box shape package thereof is generally less preferable from viewpoints of cost and size factor thereof. As one of substitutions of the butterfly module, a multi-layered ceramic package widely used in electronic devices has been attracted. The ceramic package has not only the superior size factor but an advantage to form interconnections for high frequency signals. However, the, multi-layered ceramic package inherently provides a disadvantage that light is necessary to be extracted from the ceiling thereof and the heat generated therein is necessary to be extracted from the bottom thereof, that is, a direction along which the heat is conducted to the outside of the package is substantially in parallel with the optical axis thereof. The present application is to provide one of solutions to dissipate heat from the ceramic package effectively.

SUMMARY OF INVENTION

One aspect of the present application relates to an optical module that comprises an optical assembly, a heat spreader, and a holder. The optical assembly includes a package, a semiconductor light-emitting device, a mirror and a thermo-electric cooler (hereafter denoted as TEC). The package has a frame, a ceiling, and a bottom, where they are forming a cavity into which the light-emitting device, the mirror, and the TEC are installed. The frame is made of multi-layered ceramics. The semiconductor light-emitting device emits signal light in a direction substantially in parallel with the bottom of the package. The mirror reflects the signal light toward a direction substantially perpendicular to the bottom of the package. The TEC mounts the semiconductor light-emitting device and the mirror thereon; while, the TEC is mounted on the bottom of the package. The heat spreader has a front and a bottom making substantially right angle therebetween. The front is attached to the bottom of the optical assembly. The bottom of the heat spreader is attached to a host board to dissipate heat generated in the optical assembly to the host board. The holder securely holds an intermediate assembly of the optical assembly with the heat spreader, and fastens the intermediate assembly to the host board securely.

In the optical module according to an embodiment, even when the optical assembly has an architecture that the direction along which the heat generated in the optical assembly is dissipated is in parallel to the optical axis but opposite thereto, the heat is effectively conducted to the outside via the heat spreader. Moreover, the intermediate assembly of the optical assembly with the heat spreader is securely held by the holder made of metal sheet. Thus, the present arrangement of the optical module effectively dissipates heat to the outside by a cost-effective arrangement.

BRIEF DESCRIPTION OF DRAWINGS

FIG. 1A is a perspective view of an optical module, while.

FIGS. 5A and 5B are perspective views of the FPC board, where FIG. 5A shows the FPC board before the forming, while.

FIG. 6A is a perspective view of the holder, while.

FIGS. 7A to 7C are the top view, the side view, and the side cross section of the optical module, where FIG. 7C is taken along the line VIIC-VIIC appearing in FIG. 7A.

FIGS. 8A to 8C show the outer appearance of the optical module 11 assembled with the heat spreader, the holder, and the FPC board 19, where FIG. 8B is viewed from the front bottom, and FIG. 8C is viewed from the rear top.

DESCRIPTION OF EMBODIMENTS

Next, some embodiments according to the present invention will be described as referring to drawings. In the description of the drawings, numerals or symbols same or similar to each other will refer to elements same or similar to each other without overlapping explanations.

Figure 1A:
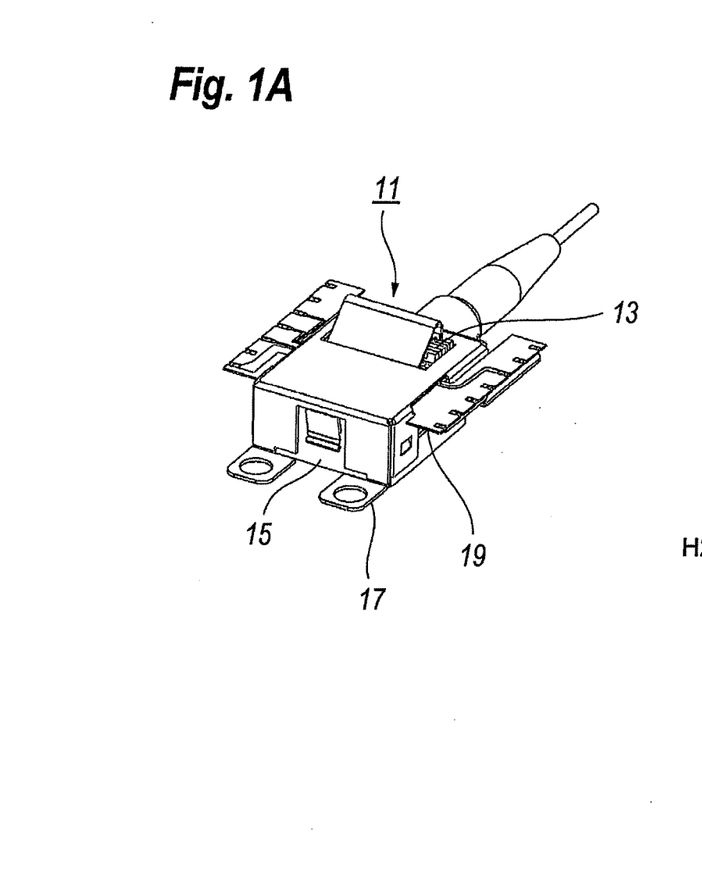
Figure 1B:
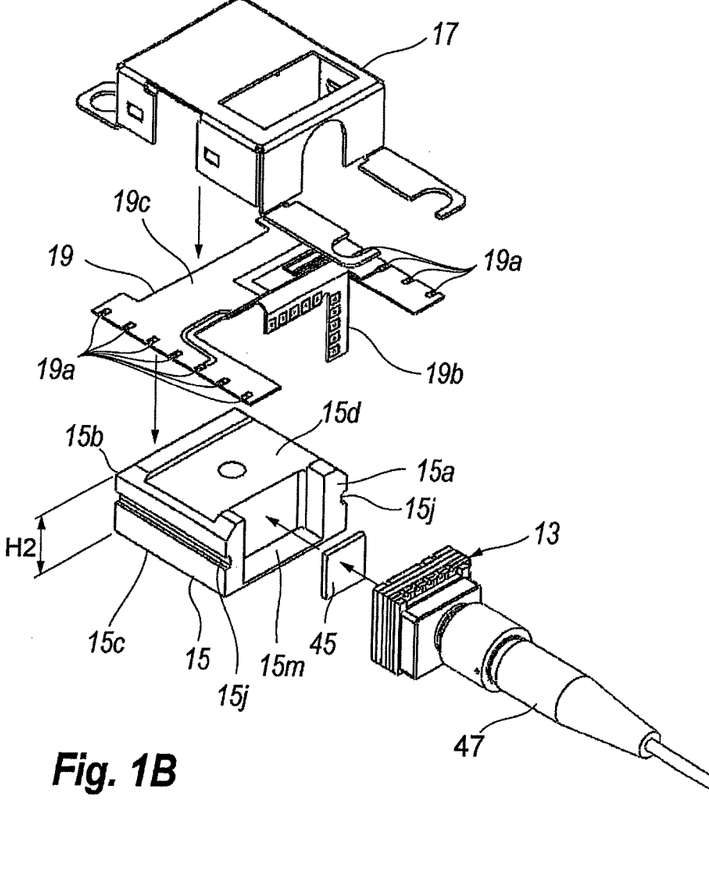
FIG. 1B is an exploded view of the optical module according to an embodiment.

FIG. 1A is a perspective view of an optical module 11, while, FIG. 1B is an exploded view of the optical module 11 according to an embodiment of the invention. As shown in FIGS. 1A and 1B, the optical module 11 includes an optical assembly 13 with a coupling unit 47, a heat spreader 15, a holder 17, and a flexible printed circuit (hereafter denoted as FPC) board 19. The optical assembly 13 is set in a pocket 15m of the heat spreader 15 via a thermal sheet 45. The FPC board 19 is electrically coupled with the optical assembly 13 so as to escape the heat spreader 15. The holder 17 holds and supports an intermediate assembly of the optical assembly 13, the heat spreader 15 and the FPC board 19.

Figure 2:
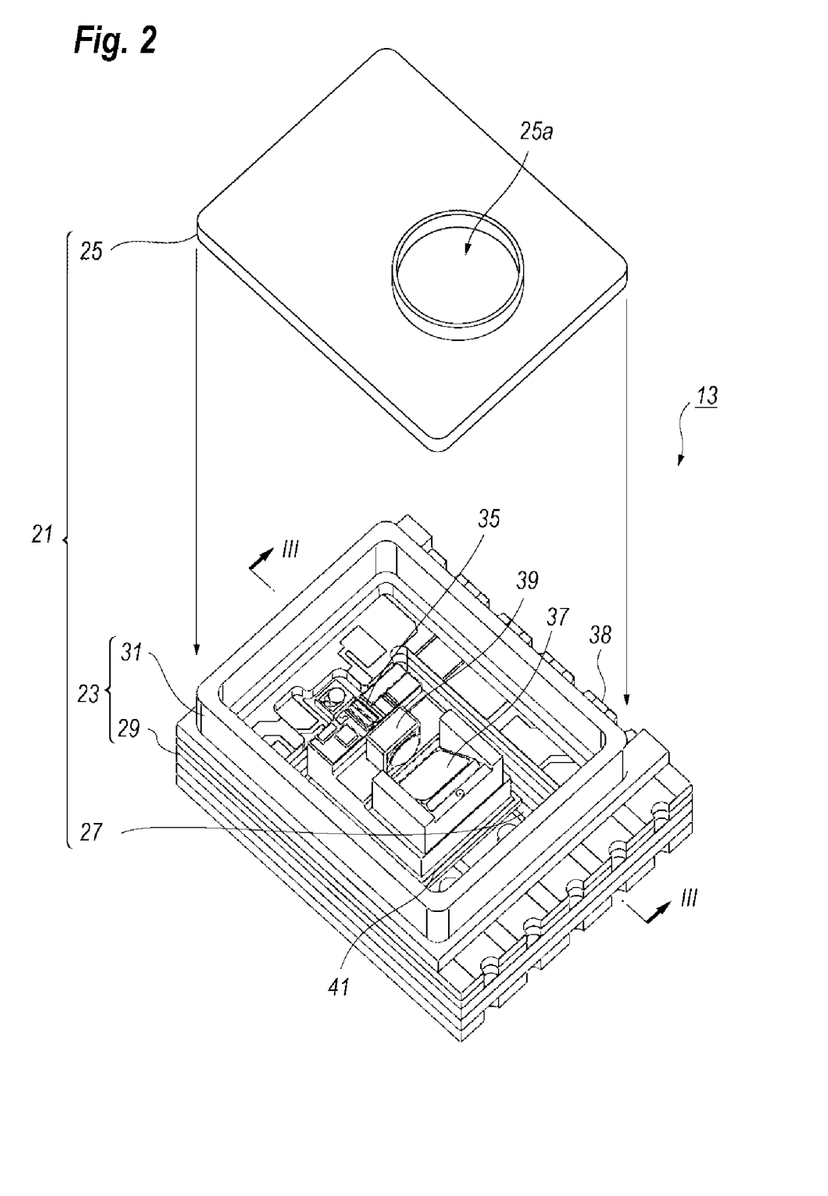
FIG. 2 is an exploded view of the optical assembly shown in FIG. 1A.

FIG. 2 is an exploded view of the optical assembly 13 shown in FIG. 1A. The optical assembly 13 includes a package 21 comprised of a housing 23 and a ceiling 25, where the housing 23 and the ceiling 25 forms a cavity into which optical components and electrical components are air-tightly enclosed. The housing 23, which has a box shape in the present embodiment, includes a frame 29 made of multi-layered ceramics, a metal seal ring 31 on the top of the frame 29, and a bottom plate 27. The metal seal ring 31 is put between the frame 29 and the ceiling 25, which is melted after the installation of components within the cavity to seal the cavity air-tightly. The ceiling 25 provides an aperture 25a covered with a window 25b in a center portion thereof, through which light generated in the cavity is extracted.

The optical assembly 13 has a plurality of electrodes in two sides adjacent to each other, with which pads provided in the FPC board 19 come in electrically contact.

Figure 3:
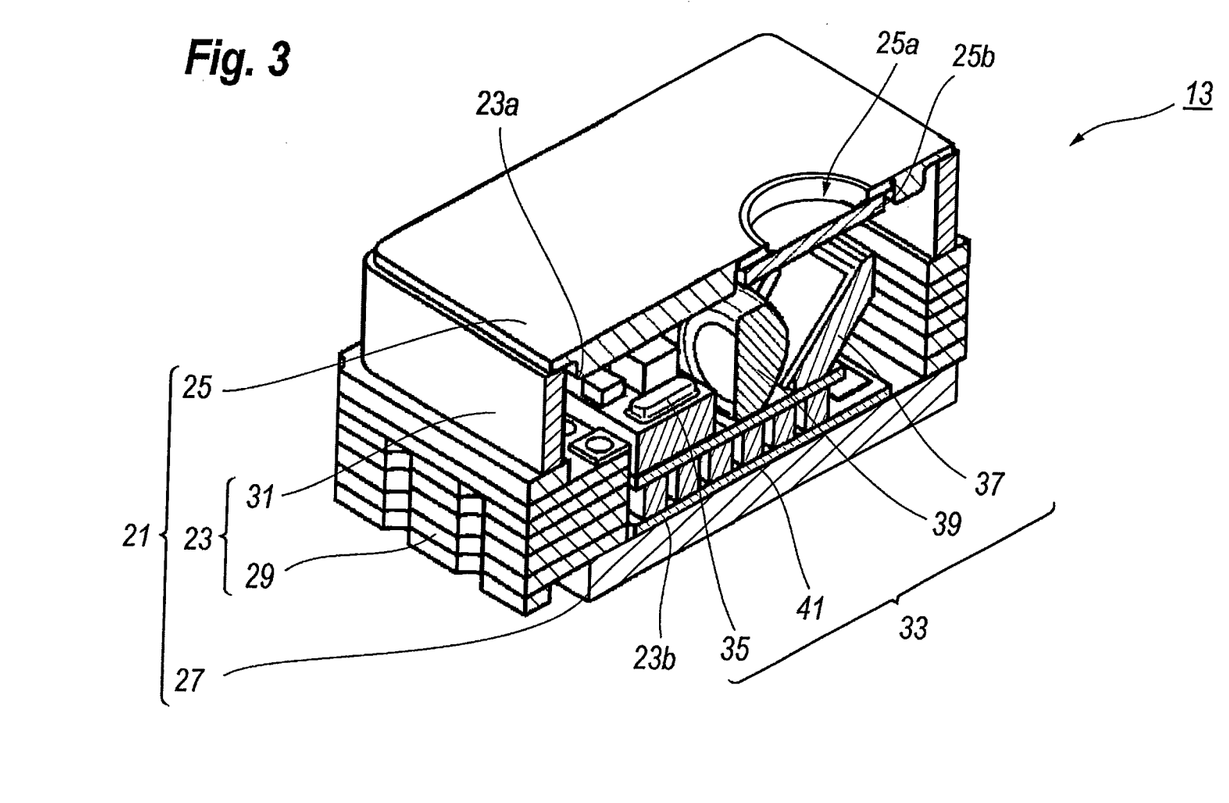
FIG. 3 is a cut view of the optical assembly taken along the line III-III appearing in FIG. 2.

FIG. 3 is a cut view of the optical assembly 13 taken along the line III-III appearing in FIG. 2. The embodiment shown in the figures is a type of an optical transmitter assembly implementing a semiconductor laser diode (hereafter denoted as LD) as an optical signal source. The cavity installs a primary assembly 33 including the LD 35 therein. That is, the primary assembly 33 includes the LD 35, a lens 39 to collimate light emitted from the LD 35, a mirror 37 to reflect the light emitted from the LD 35 and collimated with lens 39 toward upward direction, that is, the mirror 37 bends the optical axis of the LD 35 by substantially 90°. The light emitted from the LD 35 advances substantially in parallel to the bottom 23b of the housing 23, and bent by the mirror 37 toward a direction perpendicular to the bottom 27. The light is extracted through the window 25b covering the aperture 25a of the ceiling 25.

These components of the LD 35, the lens 39, and the mirror 37 are mounted on a thermo-electric controller (hereafter denoted as TEC) 41 to control a temperature of the LD 3, and the TEC 41 is mounted on the top 23b of the bottom plate 27. Thus, the LD 35, the lens 39, the mirror 37, and the TEC 41 constitute the primary portion of the optical assembly 13.

The frame 29 provides a plurality of electrodes 38 in two sides adjacent to each other. The embodiment shown in FIG. 2 provides the electrodes 38 on the top of the frame 29. However, the electrodes 29c may be formed within the multi-layer, namely, between the layers. These electrodes 38 are coupled with the FPC board 19.

Figure 4:
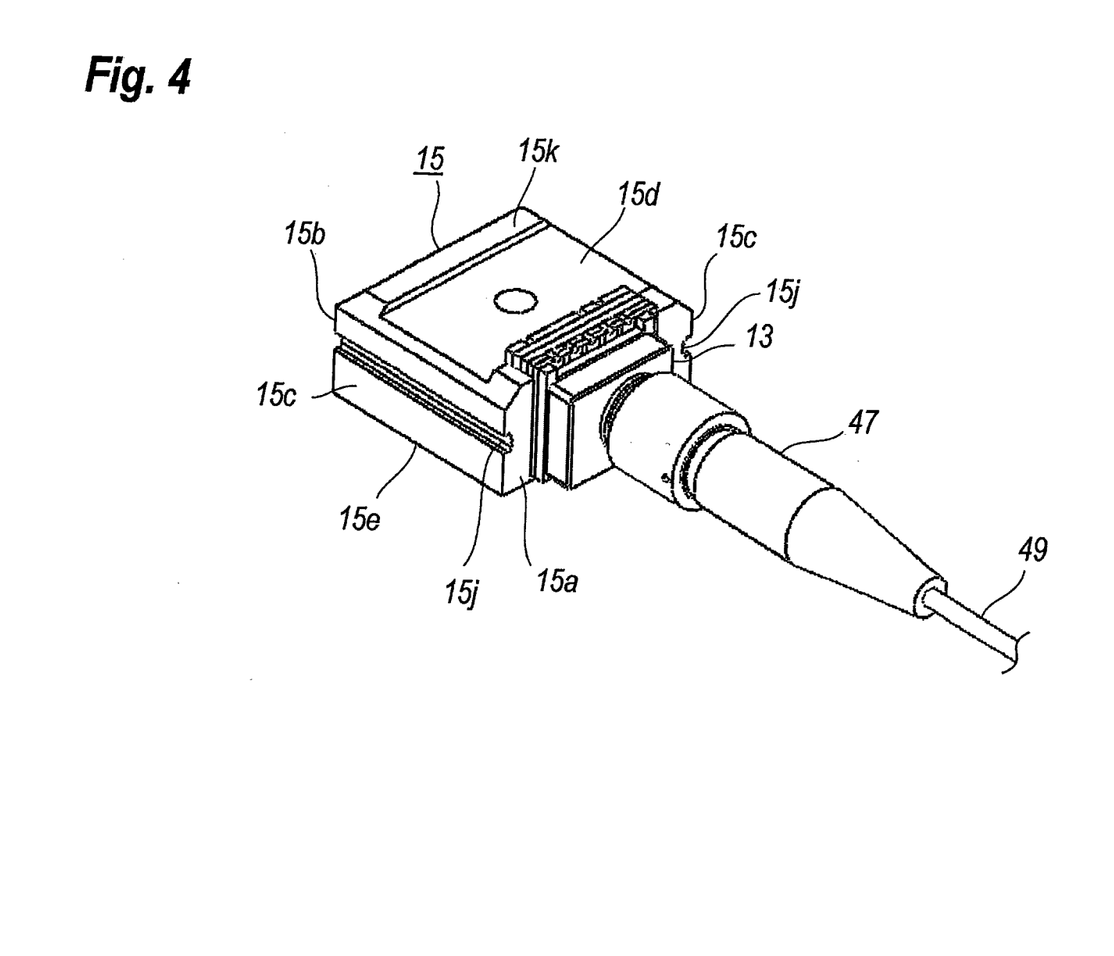
FIG. 4 is a perspective view of the optical assembly assembled with the heat spreader 15.

FIG. 4 is a perspective view of the optical assembly 13 assembled with the heat spreader 15. The heat spreader 15, which may be made of metal block, made of material with good thermal conductivity, provides a front 15a, a rear 15b, two sides 15c, and a bottom 15e. The front 15a provides a pocket 15m at which the housing 23 of the optical assembly 13 is set as putting a thermal sheet 45 therebetween. The thermal sheet 45 is an elastic material with good thermal conductivity. The sides 15c provide a grove 15j extending in substantially parallel to the bottom 15e thereof from the front 15a to the rear 15b. The grooves 15j have a function to guide the holder 17, which will be described later in this specification.

Figure 5A:
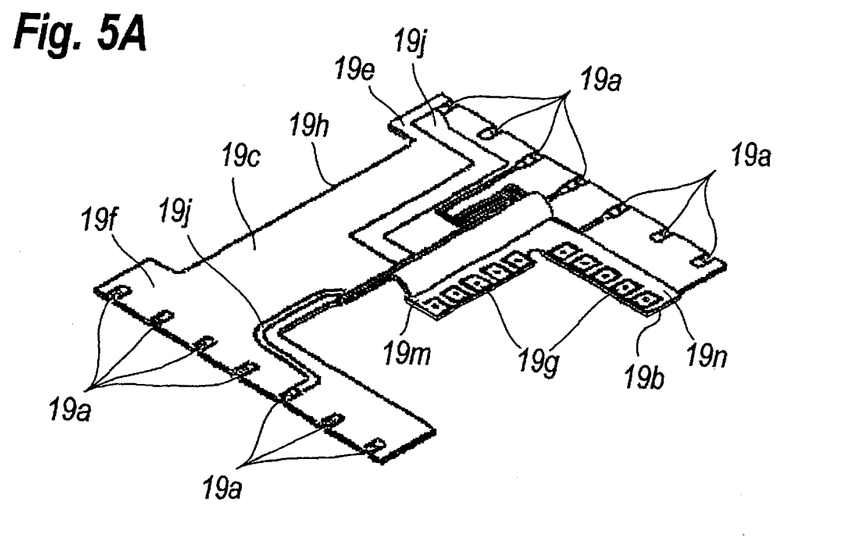
Figure 5B:
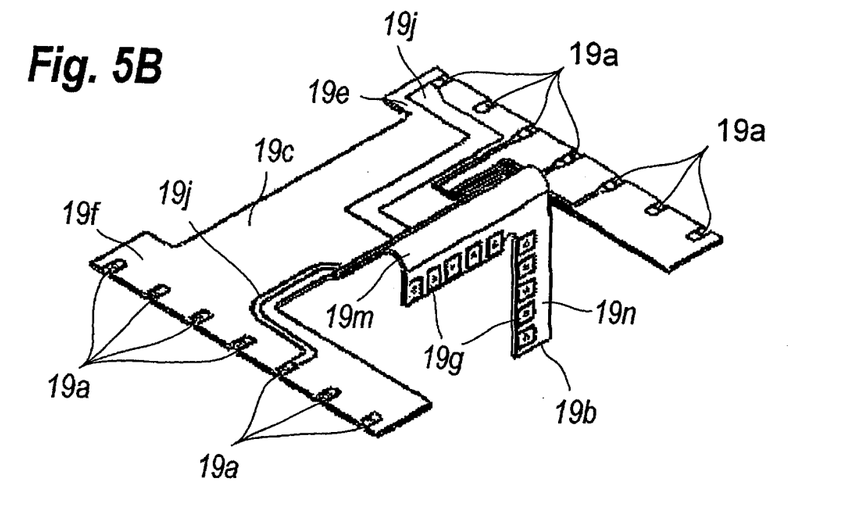
FIG. 5B shows the FPC board after the forming.

FIGS. 5A and 5B are perspective views of the FPC board 19, where FIG. 5A shows the FPC board 19 before the forming, while, FIG. 5B shows the FPC board 19 after the forming. The FPC board 19 has a plane shape of E-character with outer legs, 19e and 19f, connected by the vertical leg 19c. A center leg 19b, which corresponds to the center bar of E-character, extends from the vertical leg 19c. The outer legs, 19e and 19f, provide a plurality of pads 19a arranged along the outer edge thereof. The center leg 19b provides two arms, 19m and 19n, forming a right corner. Each of two arms, 19m and 19n, provides a plurality of pads 19g corresponding to and connected to the electrodes 38 of the frame 29 of the optical assembly 13. The pads 19g in two arms, 19m and 19n, are connected to the pads 19a on the outer legs, 19e and 19f, by interconnections 19j formed on the vertical 19c and the outer legs, 19e and 19f. The vertical leg 19c is supported by a rigid substrate 19h in the back surface thereof, which is not explicitly in the figures, while, the center leg 19b is not supported by any rigid substrate; accordingly, the center leg 19b may be flexibly bent as shown in FIGS. 5A and 5B. Specifically, the center leg 19b in two arms, 19m and 19n, thereof is extended downward to make the electrical connection between the pads 19g and the electrodes 38 in the optical assembly 13.

Figure 6A:
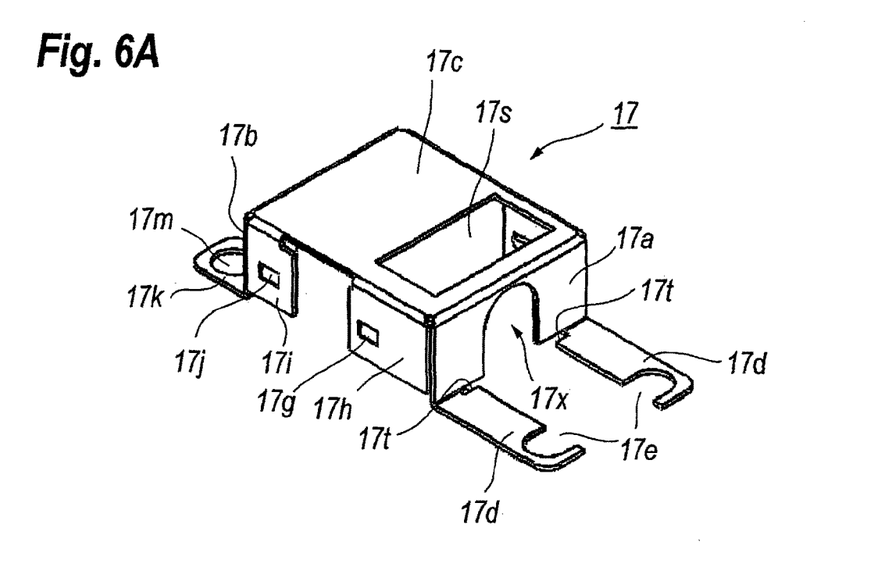
Figure 6B:
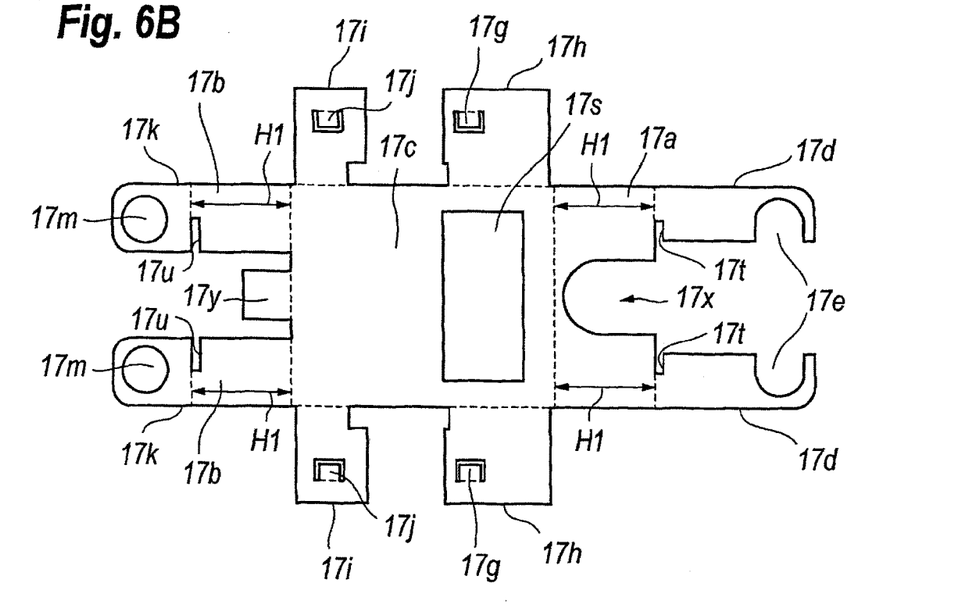
FIG. 6B is a plan view of the holder before the forming.

FIG. 6A is a perspective view of the holder 17, while, FIG. 6B is a plan view of the holder 17 before the forming. The holder 17 is formed only by cutting and bending a metal sheet without any welding and so on. The holder 17 according to the present embodiment is made of stainless steel with a thickness of 0.3 mm only by cutting and bending. The holder 17 includes a top 17c and a plurality of legs bent from the top 17c so as to leave the top 17c with a rectangular plane shape. Specifically, in the front portion, the front edge of the top 17c is first bent downward to form the front wall 17a and further bent forward to form two legs 17d. The front 17a provides a U-shaped cut 17x through which the coupling portion 47 accompanied with the optical assembly 13 extends frontward. Further, another cut 17t is formed along the line by which the second bent of the legs 17d is done. The legs 17d provides screw cuts 17e to fasten the holder 17 to the host board 51.

The holder 17 further provides front skirts 17h and rear skirts 17i each bent downward from the front side and the rear side of the top 17c by a right angle, respectively. The front and rear skirts provide U-shaped cuts, 17g and 17j, each having an inner tab slightly bent outwardly. The tabs, 17g and 17j, are set in the groove 15j of the heat spreader 15. Thus, the holder 17 may fit with the heat spreader 15.

The holder 17 in the rear portion thereof also provides two legs 17b bent downwardly from the top 17c. The legs 17b are further bent rearward to form flanges 17k each providing an opening 17m to fix the assembly of the holder 17, the heat spreader 15, and the optical assembly 13 to the host board 51. The rear legs 17b provide cuts 17u to facilitate the bending. Moreover, a center of the rear portion provides a tab 17y bent downward from the top 17c, but the length of the tab 17y is shorter than the length H1 of the rear legs 17b. The tab 17y is bent deeper than the bend of the rear legs 17b. That is, the rear legs 17b is bent downward by substantially right angle, while, the tab 17y is bent more than right angle. Thus, a tip of the tab 17y pushes the rear 15b of the heat spreader 15 frontward.

Figure 7A:
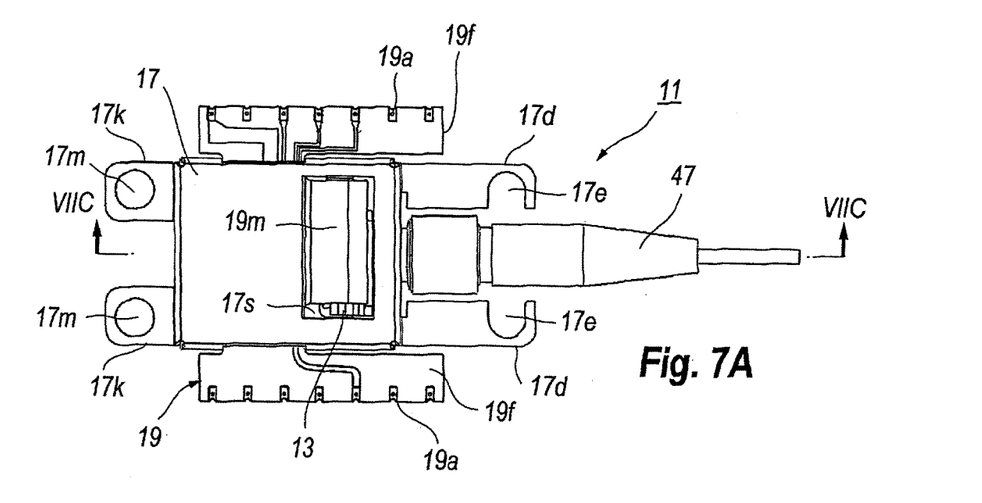
Figure 7B:
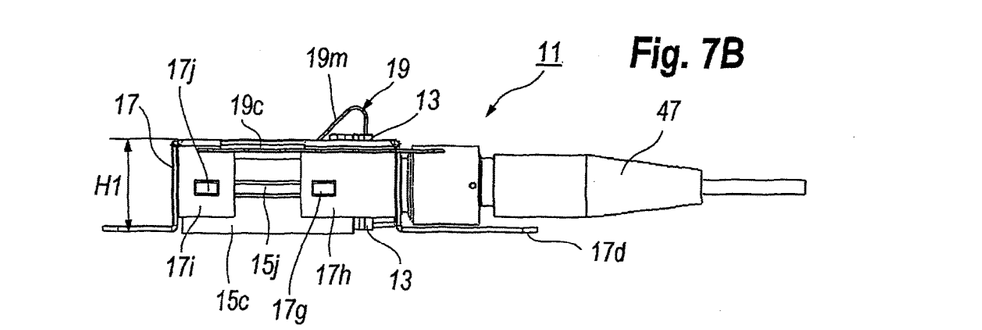
Figure 7C:
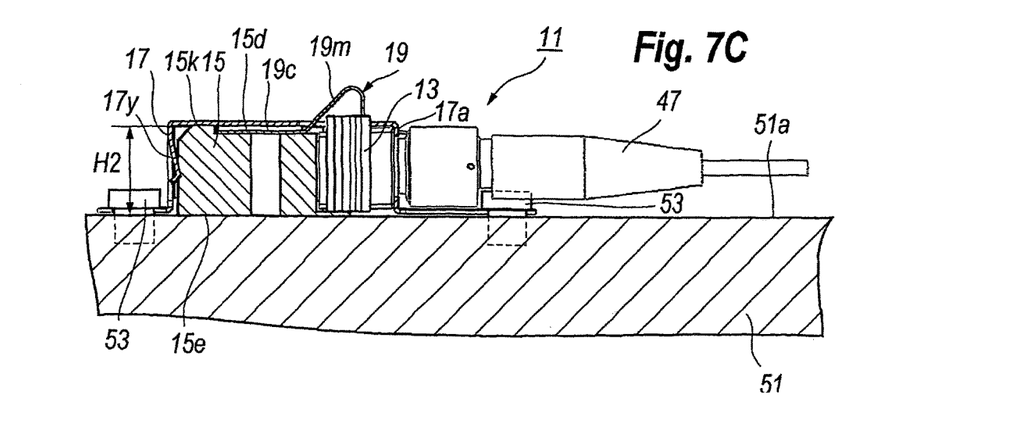

FIGS. 7A to 7C are the top view, the side view, and the side cross section of the optical module 11, where FIG. 7C is taken along the line VIIC-VIIC appearing in FIG. 7A. The optical module 11, as previously described, includes the optical assembly 13, the heat spreader 15, the holder 17 and the FPC board 19. The heat spreader 15 is arranged in the rear of the optical assembly 13, where the directions of the front and the rear are temporarily defined in sides the coupling unit 47 is provided and another side opposite to the coupling unit for the explanation sake; and does not restrict the scope of the invention.

The optical assembly 13 in the housing 23 thereof is set within a pocket 15m of the holder 15 as putting the elastic thermal sheet 45 therebetween. The optical assembly 13 of the embodiment, as shown in FIGS. 2 and 3, mounts the primary portion 33 thereof on the top 23b of the bottom plate 27 thereof. Accordingly; the heat generated within the package 21, in particular, by the TEC 41 is dissipated via the bottom plate 27. Also, the optical assembly 13 of the embodiment emits signal light toward a direction perpendicular to the ceiling 25 thereof, namely, perpendicular to the bottom plate 27, which is the direction opposite to a direction along which the external fiber 49 is extracted from the optical assembly 13. This arrangement makes it hard to dissipate heat conducted to the bottom plate 27 to the outside of the package 21. The embodiment shown in figures provides the heat spreader 15 that receives the optical assembly 13 in the pocket 15m thereof and dissipates heat conducted thereto to the external via the bottom 15e thereof.

Moreover, the intermediate assembly of the heat spreader 15 with the optical assembly 13 is held by the holder 17. That is, as shown in FIGS. 7A to 7C, the holder 17 puts the intermediate assembly between the front 17a and the rear 17b, and the rear tab 17y pushes the heat spreader 15 frontward to abut the flange of the coupling unit 47 of the optical assembly 13 against the front 17a. In addition, the heat spreader 15 is set between the front and rear skirts, 17h and 17i, respectively, of the holder 17. Thus, the heat spreader 15 is securely held by the holder 17.

The height of front 17a and the rear 17b, which is denoted as H1 in FIG. 6B, is slightly greater than the height H2 of the heat spreader 15. The cuts, 17t and 17u, provided in the end of the front 17a and the end of the rear 17b facilitate the bending of the front legs 17d and that of the rear legs 17k as keeping the dimensional accuracy against the height H2 of the holder 17 described above. The holder 17 may hook the tabs formed by the U-shaped cuts, 17g and 17i, and be bent inwardly within the groove 15j of the heat spreader 15, which securely holds the heat spreader 15 by the holder 17.

The holder 17 provides the opening 17s in the top 17c thereof. The FPC board 19 in an arched portion of one of the arms 19m extrudes from the opening 17s. While, the heat spreader 15 in the top 15d thereof provides a mound 15k in the rear end thereof to form a depression into which the FPC board 19 in the center leg 19c thereof is set therein and extracted between two skirts 17h and 17i. Thus, even when the holder 17 fully covers the top 15d of the heat spreader 15, the FPC board 19 is set between the holder 17 and the heat spreader 17, and extracted therefrom between two skirts, 17h and 17i. Moreover, because the arm 19m in the arched portion thereof extrudes from the opening 17s in the top 17c of the holder 17, the pads 19g formed on the arms, 19m and 19n, are soldered with the electrodes 38 of the optical assembly 13.

Figure 8A:
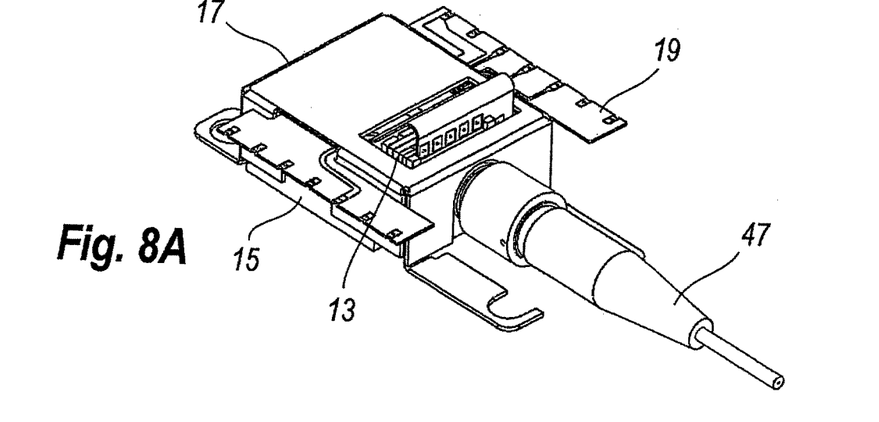
FIG. 8A is the optical module viewed from the front top.
Figure 8B:
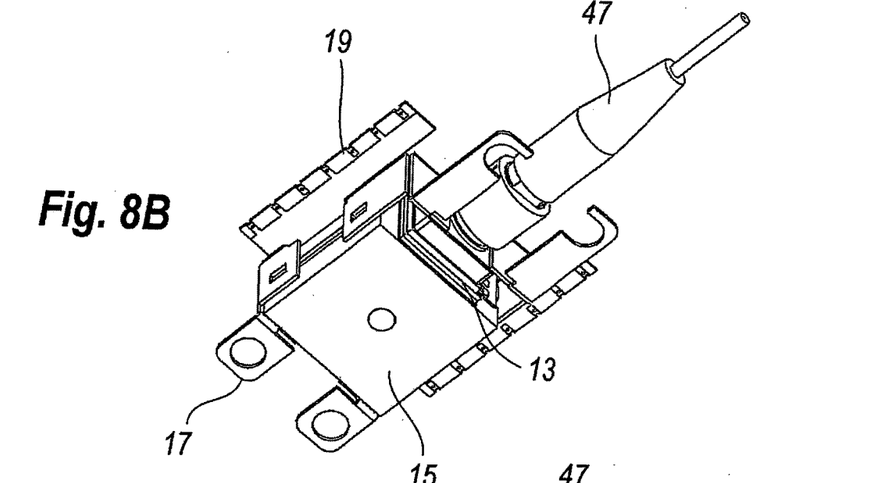
Figure 8C:
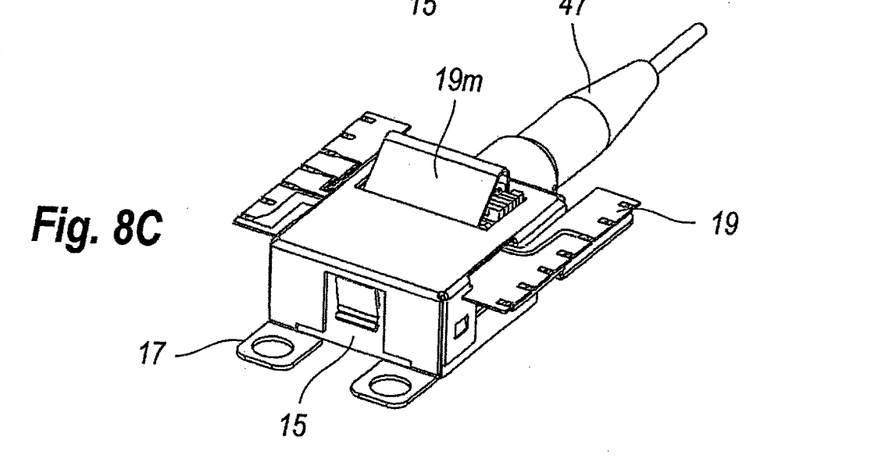

FIGS. 8A to 8C show the outer appearance of the optical module 11 assembled with the heat spreader 15, the holder 17, and the FPC board 19, where FIG. 8A is the optical module 11 viewed from the front top, FIG. 8B is viewed from the front bottom, and FIG. 8C is viewed from the rear top. As described, the intermediate assembly of the optical assembly 13, the heat spreader 15, and the FPC board 19 are securely held by the holder 17. Two legs, 19e and 19f, of the FPC board 19 are extracted between two skirts, 17h and 17i, of the holder 17 such that two legs 19e and 19f, seems to spread the wings laterally.

Figure 9:
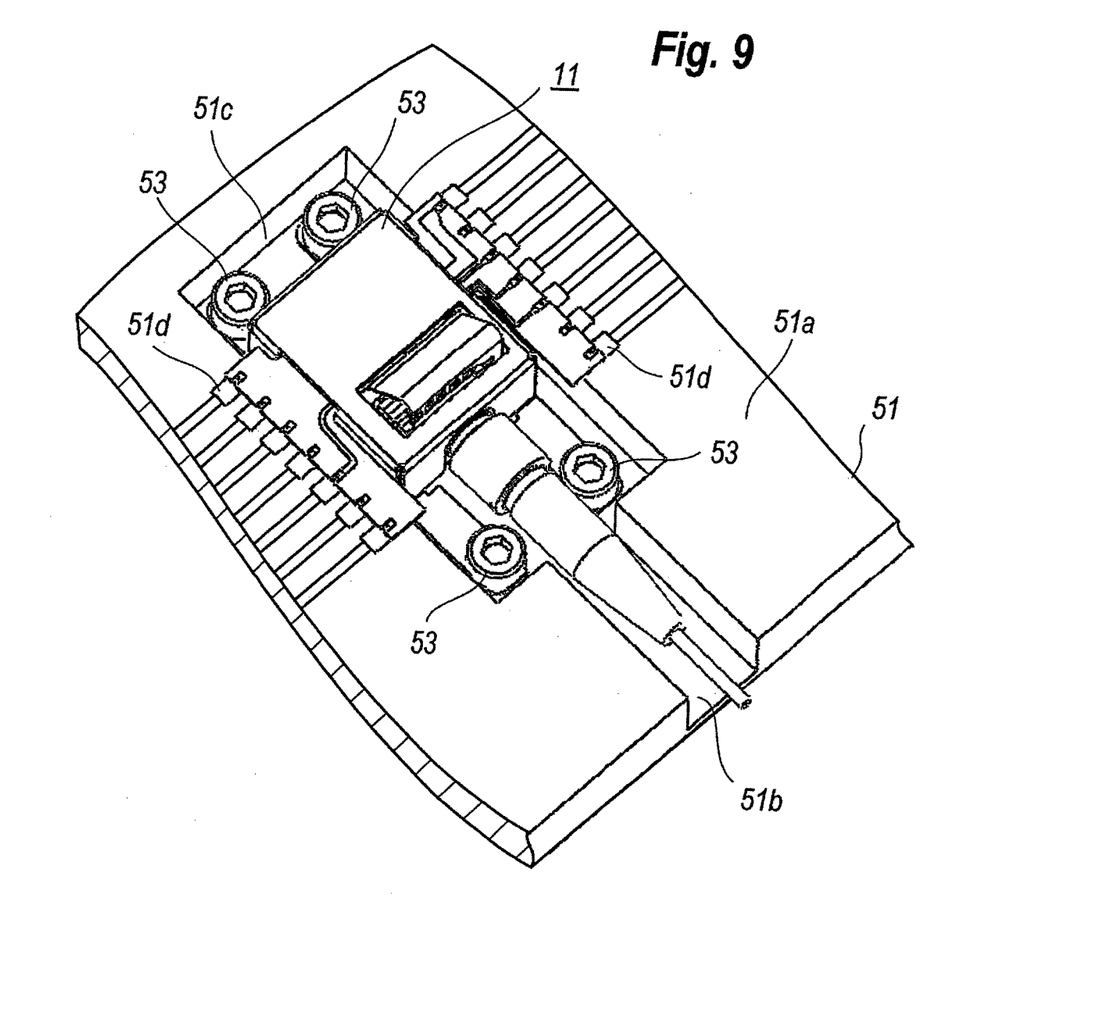
FIG. 9 shows an outer appearance of the optical module when the module is set on the host board.

FIG. 9 shows an outer appearance of the optical module 11 when the module is set on the host board 51. The host board 51 provides a groove 51b in the top 51a thereof. The coupling unit 47 is set within the groove 51b. The host board 51 further provides a pocket 51c into which the primary portion of the optical module 11 is set and fastened by screws 53 passing the holes 17m and the screw cuts 17e. The pocket 51c of the host board 51 has a depth substantially equal to the height of the heat spreader 15. Because two legs, 19e and 19f, have the level substantially equal to the top 15d of the heat spreader 15, and the legs, 17d and 17k, of the holder 17 have the level substantially equal to the bottom 15e of the heat spreader 15, the FPC board 19 may be smoothly connected with the interconnections 51d provided on the top 51a of the host board 51 even when the screws 53 tightly fasten the legs, 17d and 17k, to the host board 51.

While particular embodiments of the present invention have been described herein for purposes of illustration, many modifications and changes will become apparent to those skilled in the art. For instance, the embodiment shown in FIG. 9 provides the pocket 51c into which the optical module 11 is set, and the groove 51b in which the coupling unit 47 is set. However, the host board 51 may provide a cut into which only the optical assembly 13 and the heat spreader 15 are set. The edge of the host board 51 is aligned with the edge of the legs, 19e and 19f, of the FPC board 19. The legs, 17d and 17k, are fastened with a bottom of the host system, such as an optical transceiver into which the optical module 11 is set. Even in such an arrangement, the optical assembly 13 effectively dissipates heat to the host system via the heat spreader 15. Accordingly, the appended claims are intended to encompass all such modifications and changes as fall within the true spirit and scope of this invention.

The invention claimed is:

1. An optical module mounted on a host board, comprising:
    an optical assembly including a package, a semiconductor light-emitting device, a mirror, and a thermo-electric-cooler (TEC), the package having a frame, a ceiling and a bottom that form a cavity, the frame being made of multi-layered ceramics, the semiconductor light-emitting device emitting signal light toward a direction substantially perpendicular to the bottom of the housing, the TEC mounting the semiconductor light-emitting device and the mirror thereon, the TEC being mounted on the bottom of the housing in the cavity;
    a heat spreader having a front and a bottom making substantially right angle against the front, the front being attached to the bottom of the package, the bottom of the heat spreader being attached to the host board to dissipate heat generated in the optical assembly to the host board;
    a holder for fastening the optical assembly assembled with the heat spreader to the host board securely; and
    a coupling unit coupled with the ceiling of the package of the optical assembly, the coupling unit including a flange,
    wherein the holder includes a front, a rear opposite to the front, and skirts that form a space into which the heat spreader and the package of the optical assembly is set such that the front of the holder abuts against the flange of the coupling unit, the rear pushes the heat spreader toward the front of the holder and the skirts put the heat spreader therebetween,
    wherein the holder has front legs and rear legs, the front legs being bent from the front of the holder, the rear legs being bent from the rear of the holder, and
    wherein the holder provides cuts between the front of the holder and the front legs, and other cuts between the rear of the holder and the rear legs, the front legs being bent at the cuts between the front of the holder and the front legs, the rear legs being bent at the cuts between the rear of the holder and the rear legs.

2. The optical module of claim 1,
    wherein the front of the holder provides a cut through which the coupling unit of the optical assembly passes, and
    wherein the rear of the holder provides a tab bent inward within the space, the tab pushing the heat spreader against the front of the holder.

3. The optical module of claim 1,
    wherein the front and the rear of the holder have a height slightly greater than a height of the heat spreader.

4. The optical module of claim 1, further including a flexible printed circuit (FPC) board, wherein the FPC board includes two outer legs, a vertical leg, and a center leg that form an E-character, the vertical leg being supported by a rigid substrate and set between the heat spreader and the holder, the outer legs being extracted from respective sides of the heat spreader.

5. The optical module of claim 4, wherein the heat spreader provides a top opposite to the bottom of the heat spreader, the front of the heat spreader having a pocket into which the package of the optical assembly is set, wherein the top of the heat spreader provides a mound along rear thereof, the mound forming a depression in the top of the heat spreader into which the vertical leg of the FPC board is set.

6. The optical module of claim 4, wherein the skirts of the holder are a front skirt and a rear skirt, the outer legs of the FPC board being extracted between the front skirt and the rear skirt.

7. The optical module of claim 4, wherein the holder provides an opening through which the center leg of the FPC board extends, and the center leg of the FPC board provides two arms forming substantially right angle therebetween, the arms providing a plurality of pads electrically connected to the optical assembly.

8. The optical module of claim 7, wherein the outer legs provide a plurality of pads electrically connected to the pads provided in the arms through interconnections on the center leg.

9. The optical module of claim 1, wherein the heat spreader provides a groove in respective sides thereof, and the skirts of the holder provide tabs hooked with the groove of the heat spreader.

10. The optical module of claim 1, wherein the heat spreader provides a pocket into which the package of the optical assembly is set via a thermal sheet put between the bottom of the package and the front of the heat spreader.

* * * * *